United States Patent
Ferrari et al.

(10) Patent No.: US 11,616,161 B2
(45) Date of Patent: Mar. 28, 2023

(54) PHOTODETECTOR

(71) Applicant: Cambridge Enterprise Limited, Cambridge (GB)

(72) Inventors: Andrea Carlo Ferrari, Cambridge (GB); Luigi Occhipinti, Cambridge (GB); Alfonso Ruocco, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 0 days.

(21) Appl. No.: 17/280,791

(22) PCT Filed: Sep. 30, 2019

(86) PCT No.: PCT/GB2019/052759
§ 371 (c)(1),
(2) Date: Mar. 26, 2021

(87) PCT Pub. No.: WO2020/065356
PCT Pub. Date: Apr. 2, 2020

(65) Prior Publication Data
US 2022/0005968 A1    Jan. 6, 2022

(30) Foreign Application Priority Data
Sep. 28, 2018 (GB) ..................... 1815847

(51) Int. Cl.
*H01L 31/103* (2006.01)
*H01L 31/028* (2006.01)
*H01L 31/112* (2006.01)

(52) U.S. Cl.
CPC ........ *H01L 31/1037* (2013.01); *H01L 31/028* (2013.01); *H01L 31/1127* (2013.01)

(58) Field of Classification Search
CPC ............... H01L 31/1037; H01L 31/028; H01L 31/1127; H01L 31/09; H01L 31/112;
(Continued)

(56) References Cited

U.S. PATENT DOCUMENTS

| 8,554,022 B1 | 10/2013 | Hochberg et al. | |
| 2012/0149178 A1* | 6/2012 | Fedeli | G02F 1/025 257/E21.09 |

(Continued)

FOREIGN PATENT DOCUMENTS

| CN | 103811568 A | 5/2014 |
| CN | 108231803 A | 6/2018 |

(Continued)

OTHER PUBLICATIONS

International Searching Authority, International Search Report and Written Opinion, mailed in relationship to International Application No. PCT/GB2019/052759, dated Jan. 3, 2020 (29 pages).

(Continued)

*Primary Examiner* — Sitaramarao S Yechuri
(74) *Attorney, Agent, or Firm* — Thomas Horstemeyer, LLP

(57) ABSTRACT

A photodetector comprising an optical waveguide structure comprising at least three stripes spaced from one another such that a slot is present between each two adjacent stripes of the at least three stripes. A graphene absorption layer is provided over or underneath the at least three stripes. There is an electrode for each stripe, over or underneath the graphene absorption layer. The photodetector is configured such that two adjacent electrodes are biased using opposite polarities to create a p-n junction effect in a portion of the graphene absorption layer. In particular the portion of the graphene absorption layer is located over or underneath each respective slot between said each two adjacent stripes.

19 Claims, 3 Drawing Sheets

(58) Field of Classification Search
CPC ... H01L 27/305; H01L 27/1443; B82Y 20/00; G02B 6/122
See application file for complete search history.

(56) References Cited

U.S. PATENT DOCUMENTS

2015/0194540 A1* 7/2015 Kim .................. H01L 31/036
257/29
2015/0372159 A1 12/2015 Englund et al.

FOREIGN PATENT DOCUMENTS

WO   WO-2015087988 A1 * 6/2015   ............. G02B 6/125
WO   2016/106731 A1   7/2016

OTHER PUBLICATIONS

Intellectual Property Office, Search Report Under 17(5), mailed in relationship to GB Application No. 1815847.7, dated Mar. 1, 2019 (4 pages).
Wang, J. et al., "Graphene photodetector integrated on silicon nitride waveguide", Journal of Applied Physics, American Institute of Physics, 117(14): 144504-1-144504-5, 2015 (5 pages).
Schuler, S. et al., "Controlled Generation of a p-n Junction in a Waveguide Integrated Graphene Photodetector", American Chemical Society, Nano Letters, 16:7107-7112, 2016, (6 pages).
Gao, Y. et al., "Graphene-on-silicon nitride waveguide photodetector with interdigital contacts", Applied Physics Letters, 112: 2011107-1-20111-5, 2018 (5 pages).

* cited by examiner

PHOTODETECTOR

FIELD

This disclosure relates to generally to photodetectors, in examples to an integrated graphene broadband photodetector.

The project leading to this application has received funding from the European Union's Horizon 2020 research and innovation programme under grant agreement No 649953.

BACKGROUND

A PN junction waveguide integrated graphene photodetector is known. Such a photodetector is disclosed by Schuler et al "Controlled Generation of a p-n Junction in a waveguide Integrated Graphene Photodetector", Nano Letters 2016; and is shown in FIG. 1. In this arrangement 100, a waveguide structure having two waveguide portions 130a, 130b are formed on a substrate 110. There is a slot 135 formed between the waveguide portions 130a, 130b. A layer of graphene 115 is formed on the waveguide structure. Each waveguide portion 130a, 130b may be alternatively biased so that a photo thermal effect (PTE) is generated and p-n junction effect are realised in the graphene layer 115. A source contact 125 and a drain contact 120 are coupled with the graphene layer 115. The disadvantage of the structure of FIG. 1 is that it can work only at a wavelength of 1550 nm. The structure is limited by transparency window of silicon and waveguide cross section.

Further background prior art can be found in: US2015/0372159.

SUMMARY

According to one aspect of the present disclosure, there is provided a photodetector. The photodetector is a graphene photodetector comprising an optical waveguide structure comprising at least three stripes or fingers spaced from one another such that a slot is present between each two adjacent stripes or fingers of the at least three stripes. The photodetector also includes a graphene absorption layer provided over or underneath the at least three stripes or fingers, and an electrode for each stripe, over or underneath the graphene absorption layer. The photodetector is configured such that two adjacent electrodes are biased using opposite polarities to create a p-n junction effect in a portion of the graphene absorption layer. In particular the portion of the graphene absorption layer is located over or underneath each respective slot between said each two adjacent stripes. In implementations the biasing of the electrodes is generally provided by a voltage generator which may be a part of the photodetector or photodetector arrangement.

It will be understood that the stripes or fingers of the optical waveguide structure are discrete stripes having the slot between two adjacent stripes. In one example, the slot is an air slot. In an alternative example, the slot can be filled with a suitable material. The electrodes for waveguides be directly connected with the graphene layer over or underneath the waveguides, or there may be an insulation layer between the graphene layer and the electrodes for the waveguides.

Advantageously, the disclosed photodetector is a single device with high performance across a large spectrum, preferably for all the telecom wavelengths. The device can be used for sensing and spectroscopy as well. The multi-finger arrangement for the waveguide is advantageous for providing high efficiency and high speed for the three telecom windows. The disclosed device provides improved performance from visible to short wave infrared (SWIR) wavelengths.

The disclosed broadband photodetector can be used for integrated telecommunication receivers working at all the wavelengths starting from visible to SWIR, thus including the three transparency windows.

It is advantageous to use a silicon nitride photonic platform integrated with graphene. The first is transparent across the whole range of interest, the second absorbs constantly across the whole range of interest. The cross-section of the guiding structure is modelled with an equivalent effective index technique to guarantee quantitative constant interaction between the guided mode and the absorbing material. The result is the disclosed integrated photodetector with constant responsivity and high speed performance from visible to SWIR. It is advantageous over the conventional technology which is limited by the narrow-band absorbing material, and by the cross-section of the guiding structure which is heavily dependent on wavelength. In the conventional technology, there is generally one slot waveguide which is capable of detecting one wavelength only, and as a result they are not suitable for the full range of broadband wavelengths. The introduction of multi-finger waveguides having multiple slots ensures that the device can be used for all the wavelengths in broadband applications (multiple slots can accommodate more wavelength ranges as necessary).

In the present disclosure, the light at the different wavelengths presents a quasi-independent mode-shape. This ensures a constant interaction with graphene (the absorbing media) to result in a wavelength independent responsivity. The disclosed device can be used in integrated optical telecommunication receivers as well as in all applications requiring broadband light detection.

The optical waveguide structure may comprise at least four stripes in which: a first slot is present between a first stripe and a second stripe; a second slot is present between the first stripe and a third stripe in one (or a first) side of the first slot; and a third slot is present between the second stripe and a fourth stripe in a (second) laterally opposite side (to the first side) of the second slot. The first slot may be located between the second and third slots, and the width of the second and third slots may be greater than the width of the first slot. The third and fourth stripes each may be wider than the first and second stripes. The width of the stripes and slot are dependent on the wavelength range. An arrangement of the first and third stripes may be symmetrical to an arrangement of the second and fourth stripes. It will be appreciated that asymmetrical arrangements for waveguides are also possible.

Generally speaking, the waveguide structure has a first slot waveguide and then a further slot waveguide is placed in a first side of the first slot waveguide and another further slot waveguide is placed in a second laterally opposing side of the first slot waveguide. In a similar fashion, more slot waveguides can be provided in both sides of the first slot waveguide. The additional slot waveguides form part of the overall waveguide structure.

The photodetector may be configured such that a photothermoelectric effect (PTE) is generated in each slot.

The photodetector may further comprise a pair of contacts operatively connected with each portion of the graphene absorption layer located over or underneath each slot to extract electrical signal out of the graphene absorption layer. One contact extracts signal out from the p area and another contact extracts signal out from the n area of the p-n junction in the graphene absorption layer.

The stripes of the optical waveguide may comprise silicon nitride.

At least some of the plurality of electrodes may be metal electrodes.

At least some of the plurality of electrodes may be made of a semiconductor material.

The graphene absorbing layer may be located on top of the stripes and each electrode may be formed on top of the graphene absorption layer.

The graphene absorbing layer may be located over the stripes, and each electrode may be formed between the graphene absorption layer and each stripe of the optical waveguide structure.

The graphene absorbing layer may be located underneath the stripes, and each electrode may be formed between the graphene absorption layer and each stripe of the optical waveguide structure.

The graphene absorbing layer may be located underneath the stripes, and each electrode may be formed underneath the graphene absorption layer.

The graphene absorbing layer may be located underneath the stripes, and each electrode may be formed on top of each stripe. In such an arrangement, the stripe of the waveguide structure may comprise doped silicon.

The electrodes may cover an end portion of the stripes. The stripes may have a lower refractive index than the slots at a wavelength of operation.

It will be appreciated that the graphene layer can be vertically sandwiched between slot waveguides having multiple fingers or stripes.

According to a further aspect of the present disclosure, there is provided a graphene photodetector comprising: a wideband optical waveguide structure comprising: a first slot waveguide structure comprising a first pair of longitudinal stripes defining a first slot therebetween; a second pair of longitudinal stripes one to each side of the first slot waveguide structure defining a pair of second slots each between one of the first and second stripes, wherein the second slots are wider than the first slots. The photodetector also includes a layer of graphene bridging the first and second slots; and a set of electrodes one over or underneath each of the longitudinal stripes for biasing the electrodes to create p-n junctions in regions of the graphene over or underneath the slots.

We disclose herein a method of fabricating a photodetector as discussed above. The method may use a CMOS or CMOS-compatible process.

DRAWINGS

These and other aspects of the invention will now be further described by way of example only, with reference to the accompanying Figures, in which.

DESCRIPTION

Figure 2:
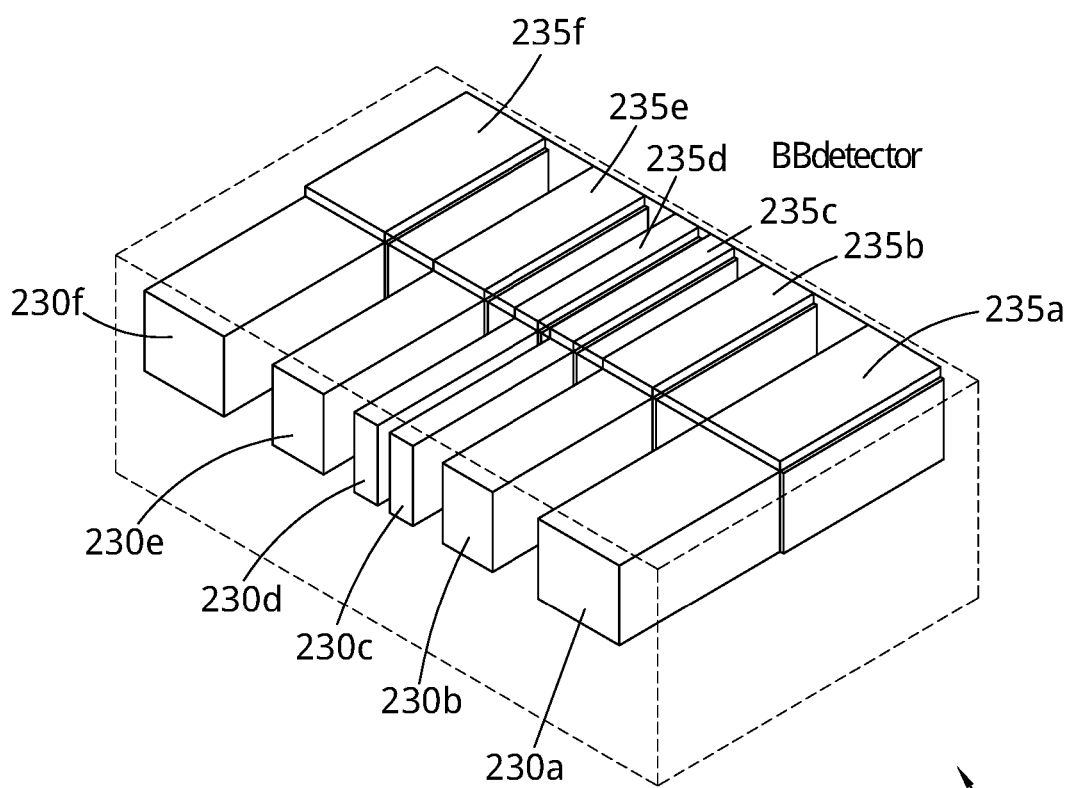
FIG. 2 shows a proposed photodetector according to one example.

FIG. 2 shows a proposed photodetector 200 according to one example. The photodetector includes a plurality of fingers or stripes 230a-f having a plurality of slots between the stripes 230a-f. An electrode 235a-f is provided for each stripe 230a-f. A graphene layer (no shown) is provided over the stripes 230a-f. In one example, the graphene layer can be between the electrodes and stripes. In another example, the graphene layer can be on top of the electrodes 235a-f where the electrodes are directly over the waveguide stripes 230a-f. In an alternative example, the electrodes and the graphene layer can be underneath the waveguide stripes 230a-f.

Figure 1:
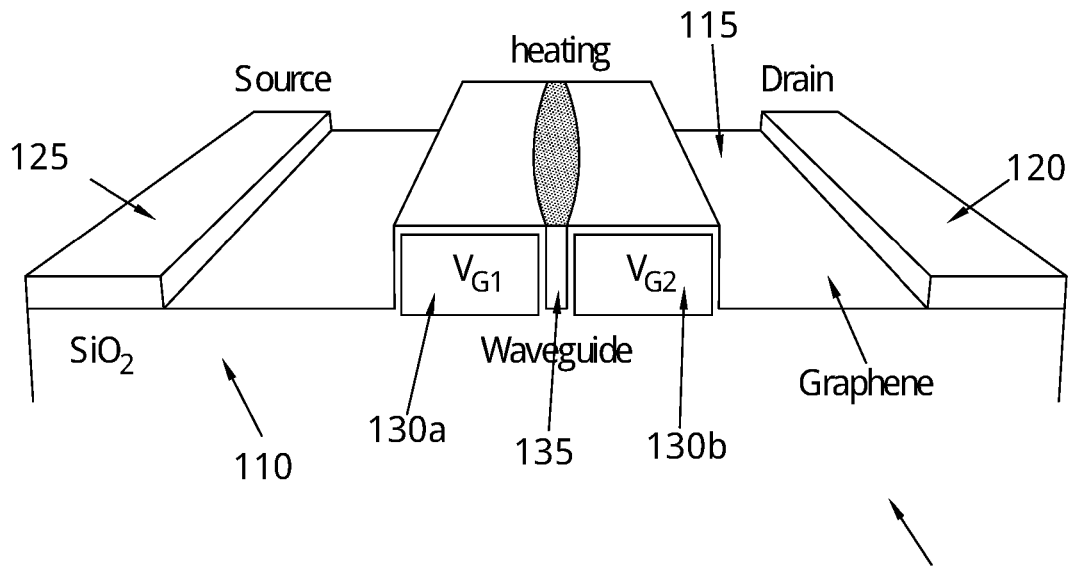
FIG. 1 shows a known graphene photodetector.

In the arrangement of FIG. 1, symmetric stripes of waveguides are formed by adding waveguide stripe 230b next to stripe 230c and by adding stripe 230e next to stripe 230d. The lateral distance between stripes 230e and 230d is the same as the lateral distance between stripes 230b and 230c. Furthermore, stripe 230a is placed in one side of 230b and stripe 230f is placed in another side of 230e. The lateral distance of between stripe 230f and stripe 230e (or the width of the slot between them) is the same as the lateral distance between stripe 230b and 230a. In one example, the width of stripes 230c, d is the same. The width of stripes 230b, e is the same. The width of the stripes 230a, f is the same. Although this type of symmetrical structure may be preferred, the invention is not restricted to such a symmetric structure. Any three waveguide stripes with two slots would be suitable for the operation of the proposed structure.

In one example, the waveguide stripes are made of silicon or silicon nitride. The electrode material may be metal or any other suitable electrode material.

Figure 3:
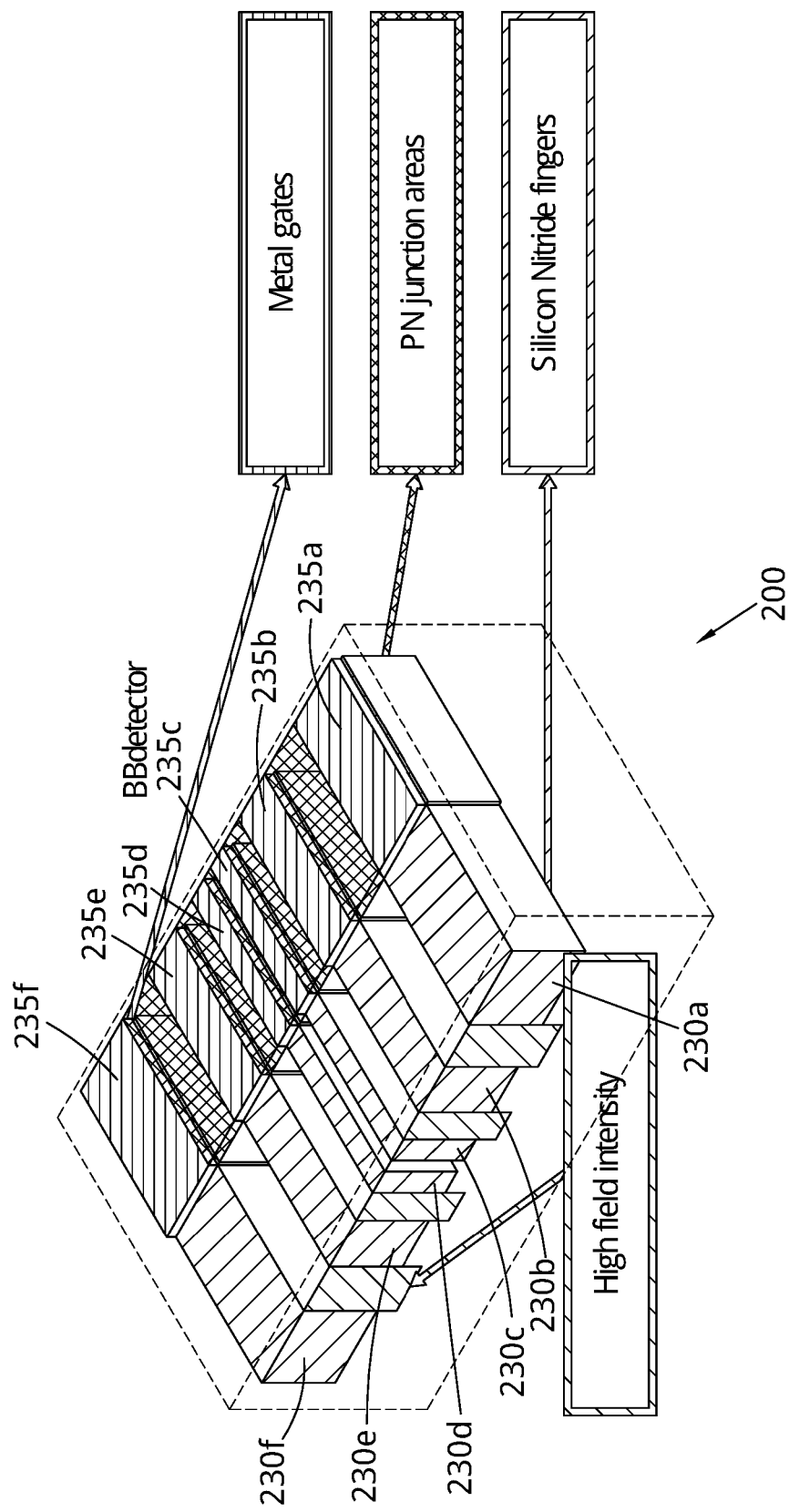
FIG. 3 shows high field intensity between waveguides of the photodetector of FIG. 2.

FIG. 3 shows high field intensity between waveguides of the photodetector of FIG. 2. There reference numerals used in FIG. 3 are the same as those in FIG. 2. When alternative biasing is applied in the electrodes 235a-f, a high field intensity is generated in the slots between the stripes 230a-f.

Figure 4:
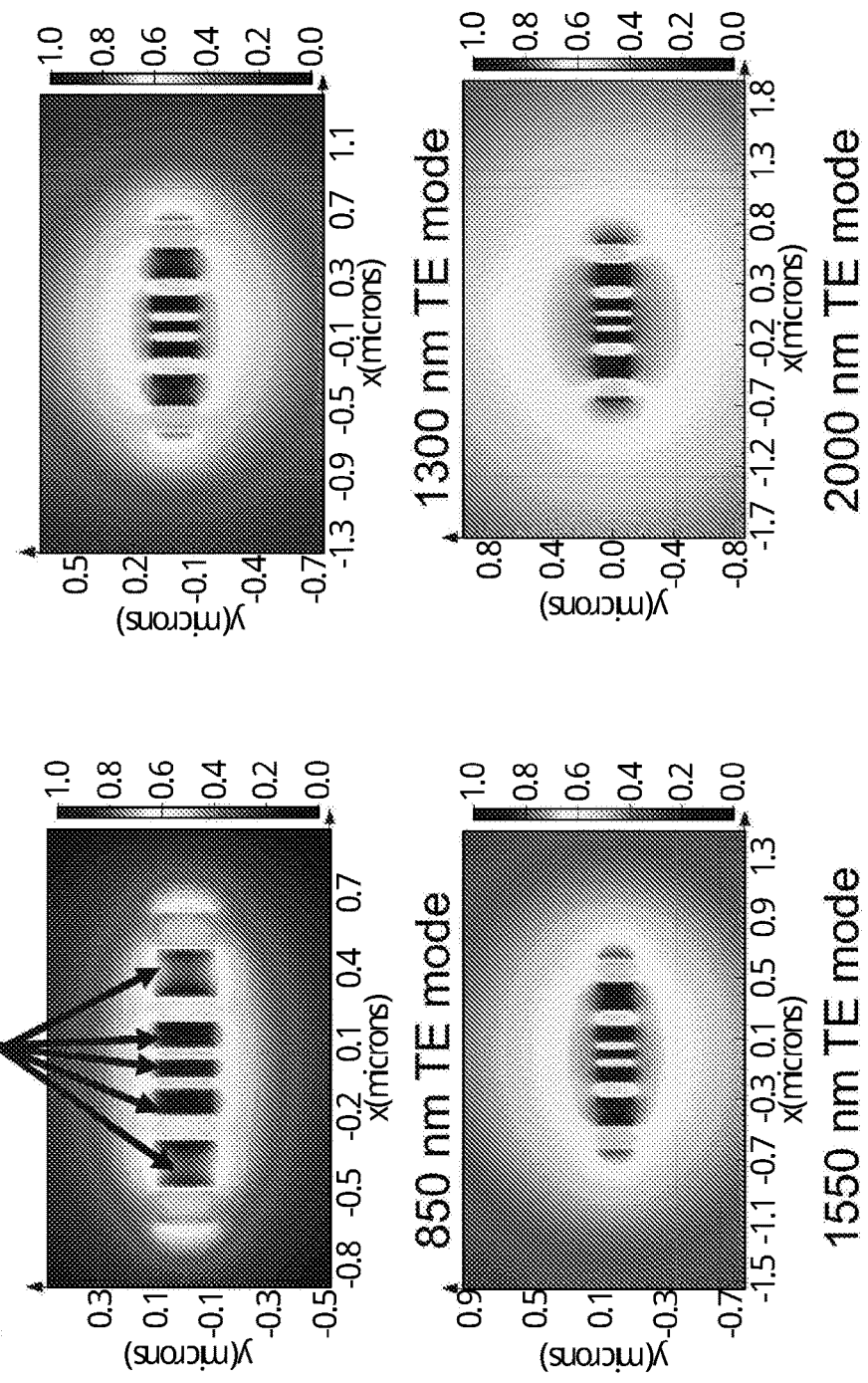
FIG. 4 shows simulation results showing high field intensity between waveguides.

FIG. 4 shows simulation results showing high field intensity between waveguides at three telecom wavelengths (e.g. 850 nm, 1300 nm, 1550 nm) and as well as 2000 nm.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A photodetector comprising:
    an optical waveguide structure comprising at least four stripes spaced from one another such that a slot is present between each two adjacent stripes of the at least four stripes, in which:
    a first slot is present between a first stripe and a second stripe;
    a second slot is present between the first stripe and a third stripe in one side of the first slot; and
    a third slot is present between the second stripe and a fourth stripe in an opposite side of the second slot;
    a graphene absorption layer provided over or underneath the at least four stripes;
    an electrode for each stripe, over or underneath the graphene absorption layer; and
    wherein the photodetector is configured such that two adjacent electrodes are biased using opposite polarities to create a p-n junction effect in a portion of the graphene absorption layer, wherein the portion of the graphene absorption layer is located over or underneath each respective slot between said each two adjacent stripes.

2. A photodetector according to claim 1, wherein the first slot is located between the second and third slots, and wherein the width of the second and third slots is greater than the width of the first slot.

3. A photodetector according to claim 2, wherein the third and fourth stripes each are wider than the first and second stripes.

4. A photodetector according to claim 1, wherein an arrangement of the first and third stripes is symmetrical to an arrangement of the second and fourth stripes.

5. A photodetector according to claim 1, wherein the stripes of the optical waveguide comprise silicon nitride.

6. A photodetector according to any claim 1, wherein at least some of the plurality of electrodes are metal electrodes.

7. A photodetector according to claim 1, wherein at least some of the plurality of electrodes are made of a semiconductor material.

8. A photodetector according to claim 1, wherein the graphene absorbing layer is located on top of the stripes and each electrode is formed on top of the graphene absorption layer.

9. A photodetector according to claim 1, wherein
the graphene absorbing layer is located underneath the stripes, and wherein each electrode is formed underneath the graphene absorption layer.

10. A photodetector according to claim 1, wherein the stripes of the waveguide structure comprise doped silicon.

11. A method of fabricating a photodetector as claimed in claim 1 wherein the method uses a CMOS or CMOS-compatible process.

12. A graphene photodetector comprising:
a wideband optical waveguide structure comprising:
a first slot waveguide structure comprising a first pair of longitudinal stripes defining a first slot therebetween;
a second pair of longitudinal stripes one to each side of the first slot waveguide structure defining a pair of second slots each between one of the first and second stripes, wherein the second slots are wider than the first slots;
a layer of graphene bridging the first and second slots; and
a set of electrodes, one over or underneath each of the longitudinal stripes for biasing the electrodes to create p-n junctions in regions of the graphene over or underneath the slots.

13. A photodetector comprising:
an optical waveguide structure comprising at least three stripes spaced from one another such that a slot is present between each two adjacent stripes of the at least three stripes;
a graphene absorption layer provided over or underneath the at least three stripes;
an electrode for each stripe, over or underneath the graphene absorption layer; and
wherein the photodetector is configured such that:
two adjacent electrodes are biased using opposite polarities to create a p-n junction effect in a portion of the graphene absorption layer, wherein the portion of the graphene absorption layer is located over or underneath each respective slot between said each two adjacent stripes; and a photo-thermoelectric (PTE) is generated in each slot.

14. A photodetector comprising:
an optical waveguide structure comprising at least three stripes spaced from one another such that a slot is present between each two adjacent stripes of the at least three stripes;
a graphene absorption layer provided over or underneath the at least three stripes;
an electrode for each stripe, over or underneath the graphene absorption layer;
a pair of contacts operatively connected with each portion of the graphene absorption layer located over or underneath each slot to extract electrical signal out of the graphene absorption layer; and
wherein the photodetector is configured such that two adjacent electrodes are biased using opposite polarities to create a p-n junction effect in a portion of the graphene absorption layer, wherein the portion of the graphene absorption layer is located over or underneath each respective slot between said each two adjacent stripes.

15. A photodetector comprising:
an optical waveguide structure comprising at least three stripes spaced from one another such that a slot is present between each two adjacent stripes of the at least three stripes;
a graphene absorption layer provided over or underneath the at least three stripes;
an electrode for each stripe, over or underneath the graphene absorption layer, wherein each electrode is formed between the graphene absorption layer and each stripe of the optical waveguide structure; and
wherein the photodetector is configured such that two adjacent electrodes are biased using opposite polarities to create a p-n junction effect in a portion of the graphene absorption layer, wherein the portion of the graphene absorption layer is located over or underneath each respective slot between said each two adjacent stripes.

16. A photodetector comprising:
an optical waveguide structure comprising at least three stripes spaced from one another such that a slot is present between each two adjacent stripes of the at least three stripes;
a graphene absorption layer provided underneath the at least three stripes;
an electrode for each stripe, wherein each electrode is formed on top of each stripe; and
wherein the photodetector is configured such that two adjacent electrodes are biased using opposite polarities to create a p-n junction effect in a portion of the graphene absorption layer, wherein the portion of the graphene absorption layer is located over or underneath each respective slot between said each two adjacent stripes.

17. A photodetector according to claim 16, wherein the stripe of the waveguide structure comprises doped silicon.

18. A photodetector comprising:
an optical waveguide structure comprising at least three stripes spaced from one another such that a slot is present between each two adjacent stripes of the at least three stripes;
a graphene absorption layer provided over or underneath the at least three stripes;
an electrode for each stripe, over or underneath the graphene absorption layer, wherein the electrodes cover an end portion of the stripes; and
wherein the photodetector is configured such that two adjacent electrodes are biased using opposite polarities to create a p-n junction effect in a portion of the graphene absorption layer, wherein the portion of the graphene absorption layer is located over or underneath each respective slot between said each two adjacent stripes.

19. A photodetector comprising:
an optical waveguide structure comprising at least three stripes spaced from one another such that a slot is present between each two adjacent stripes of the at least three stripes, wherein the stripes have a lower refractive index than the slots at a wavelength of operation;

a graphene absorption layer provided over or underneath the at least three stripes;

an electrode for each stripe, over or underneath the graphene absorption layer; and wherein the photodetector is configured such that two adjacent electrodes are biased using opposite polarities to create a p-n junction effect in a portion of the graphene absorption layer, wherein the portion of the graphene absorption layer is located over or underneath each respective slot between said each two adjacent stripes.

\* \* \* \* \*